United States Patent [19]

Cohen

[11] Patent Number: 4,951,006
[45] Date of Patent: Aug. 21, 1990

[54] ANTENNA COUPLED MILLIMETER WAVE OSCILLATOR

[75] Inventor: Leonard D. Cohen, Brooklyn, N.Y.
[73] Assignee: Eaton Corporation, Cleveland, Ohio
[21] Appl. No.: 243,433
[22] Filed: Sep. 12, 1988
[51] Int. Cl.$^5$ .......................... H03B 5/12; H03B 7/06; H03B 9/12
[52] U.S. Cl. ......................... 331/74; 331/96; 331/107 DP; 331/107 G; 331/177 V; 455/129
[58] Field of Search .............. 331/74, 107 R, 107 DP, 331/107 G, 107 T, 117 R, 117 D, 177 V; 455/129

[56] References Cited

U.S. PATENT DOCUMENTS

| | | | |
|---|---|---|---|
| 3,875,513 | 4/1975 | Strull et al. | 455/129 |
| 4,246,550 | 1/1981 | Cohen | 331/107 DP |
| 4,728,907 | 3/1988 | Cohen | 331/107 R |

OTHER PUBLICATIONS

J. Altman, *Microwave Circuits*, Van Nostrand Company, Inc., Princeton, N.J., 1964, p. 247.
F. Terman, *Radio Engineering*, McGraw Hill Book Co., 1947, pp. 464–465.
J. Markus, *Electronics Dictionary*, McGraw Hill Book Co., New York, 1966, p. 370.
L. Cohen, "Active Phase Shifters for the Millimeter and Microwave Bands", IEEE MTT-S Digest, 1984, pp. 397–399.
L. Cohen, "Varactor Tuned Gunn Oscillators with Wide Tuning Range for the 25-75 GHz Frequency Band", IEEE MTT-S, Microwave Symposium Digest, pp. 177–179, Apr. 1979, Reprint Designation 79-6, pp. 1-3.
H. Jasik, *Antenna Engineering Handbook*, Chapter 3, C. Tai, "Characteristic of Linear Antenna Elements", pp. 3-4 and 3-5, FIGS. 3-3 and 3-4, McGraw Hill Book Co., New York, 1961.
F. Terman, *Electronic and Radio Engineering*, Chapter 5, "Wave Guides and Cavity Resonators", pp. 157 and 158, McGraw Hill Co., New York, 1955.
T. Moreno, *Microwave Transmission Design Data*, "Obstacles, Discontinuities and Junctions", pp. 154–156, McGraw Hill Book Co., New York, 1948.

Primary Examiner—Siegfried H. Grimm
Attorney, Agent, or Firm—Andrus, Sceales, Starke & Sawall

[57] ABSTRACT

An oscillator (10) operational in the millimeter wave range including frequencies greater than 30 GHz includes a lumped element active circuit (12) including an active element (14) with a negative resistance, a lumped element resonator circuit (16) in parallel therewith, and an antenna (18) extending directly from the oscillator without an intermediate impedance matching section therebetween and without an isolation element therebetween. The antenna has a length of nominally a quarter wavelength at the desired fundamental frequency, and has zero connection length from the oscillator. The antenna serves a dual function of radiating the energy generated by the oscillator and also transforming the output impedance of the oscillator to the impedance of transmission media providing a load, such as free space or a wave guide. The antenna is spaced rearwardly of a front housing wall having a resonant iris output port designed to be parallel resonant at the fundamental frequency, such that the iris functions to transmit energy generated by the oscillator at the fundamental frequency, and to appear as a low impedance shunt at the second harmonic to suppress the transmission of energy generated at the second harmonic. The antenna is spaced forwardly of a back housing wall by a distance of nominally a quarter wavelength at the second harmonic, such that the back wall provides a short circuit. The invention includes application not only in existing fixed oscillator and VCO technology, but also in spatial power combining technology.

20 Claims, 2 Drawing Sheets

ANTENNA COUPLED MILLIMETER WAVE OSCILLATOR

This invention was made with Government support under contract number DAAK20-84-C-0395 awarded by the U.S. Army. The Government has certain rights in this invention.

BACKGROUND AND SUMMARY

The invention relates to oscillators, including fixed oscillators and varactor tuned oscillators (VCOs), operation in the millimeter wave range including frequencies greater than 30 GHz.

The invention includes application not only in existing oscillators, but also in spatial power combiners. Spatial power combining is an emerging technology for current and future electronic warfare, radar, missile guidance and communication transceiver applications. A spatial combiner overcomes the intrinsic limitations on the power generating capability of millimeter wave solid state continuous wave active devices by combining the output of a multiplicity of active devices.

In preferred form, the invention provides a solid state millimeter wave oscillator in lumped element circuit form uniquely including an integral short wire antenna. The antenna serves the dual function of radiating the energy generated and also impedance matching the load to the oscillator. The antenna provides a simple means to transform the output impedance level of the oscillator (typically about 50 ohms) to the higher impedance level of free space or a waveguide (i.e. greater than or equal to about 377 ohms) providing a load. (The impedence of free space is 377 ohms. The impedence of a waveguide is greater than that of free space.) The invention eliminates the need for a separate antenna in a spatial power combining application.

The invention also provides significant improvements in miniaturization of a solid state millimeter wave oscillator. The oscillator is sufficiently small that it can be used as an active antenna element in a multi-dimensional array of such active antennas. A performance advantage results from such uniquely small size. In active antenna arrays, a close spacing of elements (typically half wavelength, i.e. 0.118 inch at 50 GHz) is necessary to prevent the generation of major secondary radiation lobes. The oscillator inherently satisfies the criteria for close spacing by virtue of its miniature circuit size (e.g. 0.089 inch by 0.089 inch at 50 GHz). The miniature size follows from the use of a lumped element circuit embodiment and its direct connection to an integral thin wire or ribbon antenna, typically a quarter wavelength long (e.g. 0.005 inch wide by 0.0005 inch thick by 0.06 inch long at 50 GHz). An intermediate impedance matching section is not required, as is conventionally used to couple an oscillator to a load. The required impedance matching between the oscillator and its load is accomplished by appropriately shaping the antenna and changing its length.

Also in accordance with the invention, an oscillator is provided with an integral antenna as the output coupling and matching element that is sufficiently short that it precludes the known "long line" effect. This effect adversely affects the frequency stability of an oscillator. The "long line" effect occurs when an oscillator is not terminated in a matched load and some load reactance is present, J. Altman, *Microwave Circuits,* Van Nostrand Company, Inc. Princeton, N.J. 1964, page 247, F. Terman, *Radio Engineering,* McGraw Hill Book Company, Inc., 1947, pages 464–465, J. Markus, *Electronics Dictionary,* McGraw Hill Book Company, N.Y. 1966, page 370. A long line length (greater than a quarter wavelength) between an oscillator and an unmatched load can result in frequency jumping or turn-on at an undesired frequency. The longer the line length, the larger are the number of undesired frequencies at which the fixed oscillator or VCO can operate. A simple means to eliminate the "long line" effect is to use an isolation element, e.g. an isolator or buffer amplifier, between the oscillator output and the load. The use of an isolation element adds RF (radio frequency) loss, size and cost to the oscillator. This is especially burdensome in active antenna array or phased array applications, for example, where a large number of oscillators are used.

In the present invention, the "long line" effect is precluded by the short length of the integral antenna (nominally a quarter wavelength long) and the zero connection length that follows from its direct connection to the oscillator. The invention eliminates the need for an isolation element and its associated penalties of RF power loss, size and cost. The size of an isolation element, as required with other oscillator circuits, precludes the realization of an active antenna array with close active element spacing noted above.

Also in accordance with the invention, a VCO is provided for use as the active antenna element in a spatial power combiner that uniquely provides for higher output power, higher efficiency and higher side lobe suppression than realizable with the use of a fixed oscillator as the active antenna element. A conventional spatial power combiner uses fixed oscillators as the active device. The multiplicity of fixed oscillators are made frequency coherent by self injection locking. When all the fixed oscillators are injection locked, they will not be phase coherent since all fixed oscillators were not at the same frequency prior to injection locking, due to slight constructional and component differences. After locking, all the fixed oscillators will be at the same frequency but each will operate at a phase angle determined by the difference between its free running frequency and the injection locked frequency. The phase difference between the fixed oscillators will result in the composite output power of the combiner being less than the sum of the output power of the individual oscillators. The composite output power would be equal to the sum of the individual locked oscillators if all oscillators had the same phase.

The use of a VCO, rather than a fixed oscillator, as the active element provides a means to control the phase of each locked VCO and thereby increase the output power and combining efficiency of the array. If a VCO is frequency locked and then its tuning voltage is changed, the frequency will remain constant but the phase of the VCO output will change. Hence, after an array of VCO active antenna elements are injection locked, a change of the varactor voltage of each individual active element will provide the means to establish a common phase for all VCOs and hence maximum composite power output.

The phase control capability provided by the use of a VCO, rather than a fixed oscillator, as an active antenna element in an antenna array also provides a means to electronically control the spatial distribution of the radiated composite output. In a broadside array, for example, the active elements are spaced one half wavelength apart and should all be at zero relative phase. If the criteria of zero phase is not met, the radiation pattern of the composite output will exhibit degraded directional properties. The electronic phase control provided by the use of a VCO permits the phase correction required after injection locking to obtain a nondegraded radiation pattern.

The use of a VCO, rather than a fixed oscillator, as the active antenna element also provides frequency agility to the combiner. To change frequency, the VCOs would be unlocked, tuned to the new desired frequency, injection locked at the new frequency and then phase adjusted, as described, to obtain maximum composite output from the combiner and optimum radiation characteristics. Active phase shifting is discussed in L. Cohen, "Active Phase Shifters For The Millimeter And Microwave Bands", IEEE MTT-S Digest, 1984, pages 397-399.

DETAILED DESCRIPTION

Figure 1:
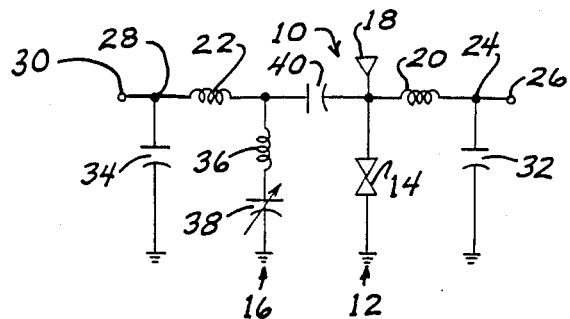
FIG. 1 is a circuit diagram showing an oscillator in accordance with the invention.

FIG. 1 is a circuit diagram showing an oscillator 10 operational in the millimeter wave range including frequencies greater than 30 GHz. The invention includes fixed oscillators and variable oscillators, including VCOs, in turn including varactor tuned Gunn oscillators. For further background regarding oscillators, including fixed oscillators and VCOs including varactor tuned Gunn oscillators, reference is made to Cohen U.S. Pat. Nos. 4,246,550, 4,728,907, and to "Varactor Tuned Gunn Oscillators With Wide Tuning Range For The 25-75 GHz Frequency Band", IEEE-MTT-S, Microwave Symposium Digest, pages 177-179, April 1979, reprint designation 79-6, pages 1-3, all incorporated herein by reference.

The oscillator includes a lumped element active circuit 12 including an active element 14 with a negative resistance, such as a Gunn or Impatt diode, FET, etc. The oscillator includes a lumped element resonator circuit 16 in parallel with the active circuit and providing resonant circuitry in combination therewith. The lumped element circuit concept is based on the use of circuit elements that are sufficiently small (electrically) that they are functionally characterized as lumped elements. An integral thin wire monopole antenna 18 extends directly from the oscillator without an intermediate impedance matching section therebetween and without an isolation element therebetween. The antenna has a length of nominally an odd quarter wavelength (i.e. a quarter wavelength or an integral odd multiple thereof) at the fundamental frequency of the oscillator, and has zero connection length from the oscillator. An antenna length of one quarter wavelength is preferred. Nominally means within a given tolerance deviation range, e.g. ±20%, etc.

The oscillator includes an active element bias choke 20 and a resonator tuning bias choke 22, each nominally a quarter wavelength long. A Gunn diode active element bias terminal 24 is connected to an input coaxial line 26, and tuning bias terminal 28 is connected to an input coaxial line 30. Low pass RF bypass filters are provided by respective chip capacitors 32, 34 connected between respective bias terminals 24, 28 and ground. Choke 20 has a first terminal connected to bias terminal 24. Active circuit 12 including Gunn diode 14 has a first terminal connected to antenna 18 and to the second terminal of choke 20, and has a second terminal connected to ground. Resonator circuit 16 comprises a series lumped inductor 36 and capacitor 38 which may be a fixed resonator capacitor or in preferred form a varactor capacitor. Circuit 16 has a first terminal connected through DC blocking capacitor 40 to antenna 18, and a second terminal connected to ground.

Figure 2:
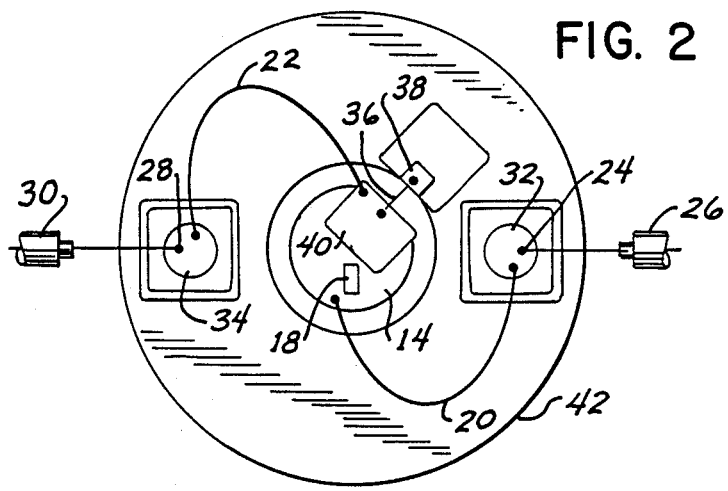
FIG. 2 shows the packaged form of the circuitry of FIG. 1.
Figure 3:
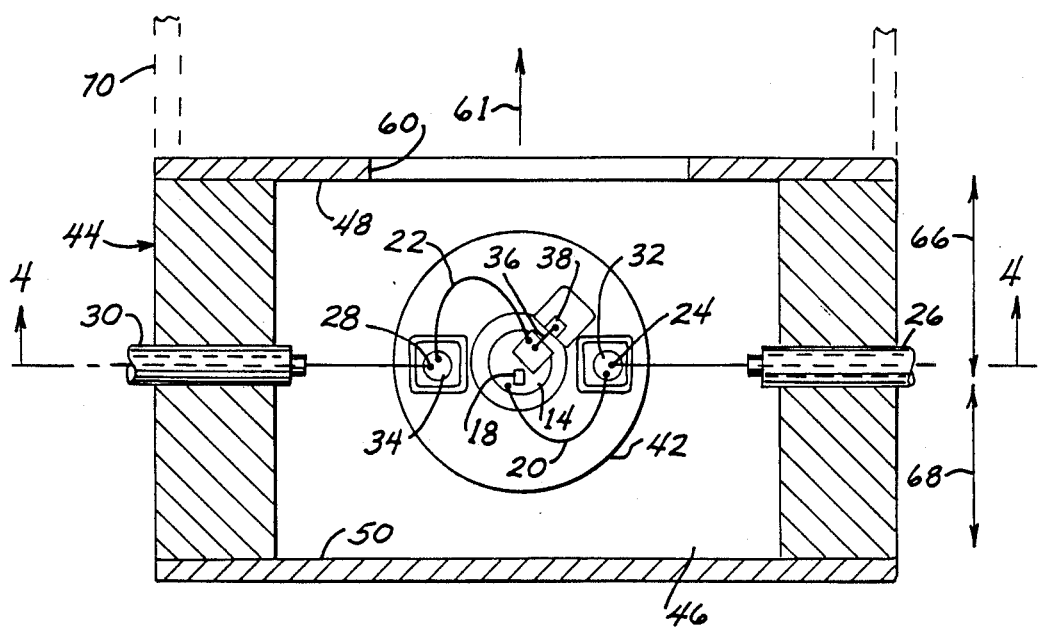
FIG. 3 shows the circuitry of FIG. 2 in housing support structure.

As shown in FIG. 2, the circuitry is mounted on flange 42 of the Gunn diode, which flange has a diameter of 0.115 inch, similarly as shown in FIG. 12 of above incorporated U.S. Pat. No. 4,728,907. The oscillator circuitry is mounted in a metal housing 44, FIGS. 3 and 4, having a bottom wall 46, FIG. 4, and front and back side walls 48 and 50, FIG. 3, extending upwardly therefrom. The flange 42 of Gunn diode 14 is received in counterbore 52 of bottom wall 46 and is engaged from below by threaded metal stud 54 in threaded bore 56. During installation, top plug 58 is removed, and stud 54 with diode 14 thereon is dropped downwardly into the housing, and stud 54 is threaded downwardly from above into bore 56 until flange 42 seats in counterbore 52.

Antenna 18 is directly connected by tack welding or bonding or the like to the circuitry at the top terminal of Gunn diode 14 and extends upwardly therefrom within the housing and is spaced between the front and back walls 48 and 50. Front wall 48 includes an output port provided by a resonant iris aperture 60 therethrough at a given height 62 above bottom wall 46. Antenna 18 extends upwardly to a top end 64 at about the height of resonant iris 60. Resonant iris 60 is an elongated slot-like aperture through front wall 48 and extending parallel to bottom wall 46. Antenna 18 extends upwardly and perpendicular to elongated slot-like aperture 60. Antenna 18 has a preferred length of nominally a quarter wavelength. Aperture 60 is centered in the waveguide cross section which is a fixed dimension for a given waveguide band. The height of the antenna is not a fixed dimension in that its length (nominally a quarter wavelength) is determined by the center frequency of the desired tuning range. Hence, if the tuning range is designed for the low end of the waveguide band, the antenna length would be longer than if the tuning range was designed for the high frequency end of the waveguide band.

The oscillator has a fundamental desired output frequency, and a second harmonic frequency equal to twice the fundamental frequency. Antenna 18 is spaced rearwardly of front wall 48 by a distance 66 of nominally an odd quarter wavelength at the second harmonic frequency, and preferably one-quarter wavelength. Antenna 18 is spaced forwardly of back wall 50 by a distance 68 of nominally an odd quarter wavelength at the fundamental frequency, and preferably one-quarter wavelength. The energy generated by the oscillator is transmitted by antenna 18 through resonant iris 60 to transmission media as shown at arrow 61 which may be free space, or may be defined by a waveguide such as shown in dashed line at 70, FIG. 3.

As noted above, impedance matching between the oscillator and the load provided by the transmission media (free space or waveguide) is accomplished by appropriately shaping the antenna and changing its length in accordance with known relations, for example as shown in H. Jasik, *Antenna Engineering Handbook*, Chapter 3, C. Tai, "Characteristics of Linear Antenna Elements", pages 3-4 and 3-5, FIGS. 3—3 and 3-4, McGraw Hill Book Co., N.Y., 1961. As above noted, it is preferred that the antenna have a length 62 of nominally one-quarter wavelength at the desired fundamental output frequency and extend upwardly to about the height of resonant aperture 60. Resonant iris 60 is spaced forwardly of the antenna by a distance of nominally an odd quarter wavelength, and preferably one-quarter wavelength, at the second harmonic frequency and suppresses energy radiated by the antenna at the second harmonic frequency, and transmits energy radiated by the antenna at the fundamental frequency. Conductive back wall 50 provides a short circuit spaced rearwardly from the antenna by a distance 68 of nominally a quarter wavelength at the fundamental frequency and on the opposite side of the antenna from resonant iris 60. For further background regarding resonant irises and low shunting reactances, reference is made to F. Terman, *Electronic And Radio Engineering*, Chapter 5 "Wave Guides And Cavity Resonators", pages 157 and 158, McGraw Hill Co., N.Y., 1955, and to T. Moreno, *Microwave Transmission Design Data*, "Obstacles, Discontinuities And Junctions", pages 154–156, McGraw Hill Book Co., N.Y., 1948.

Figure 4:
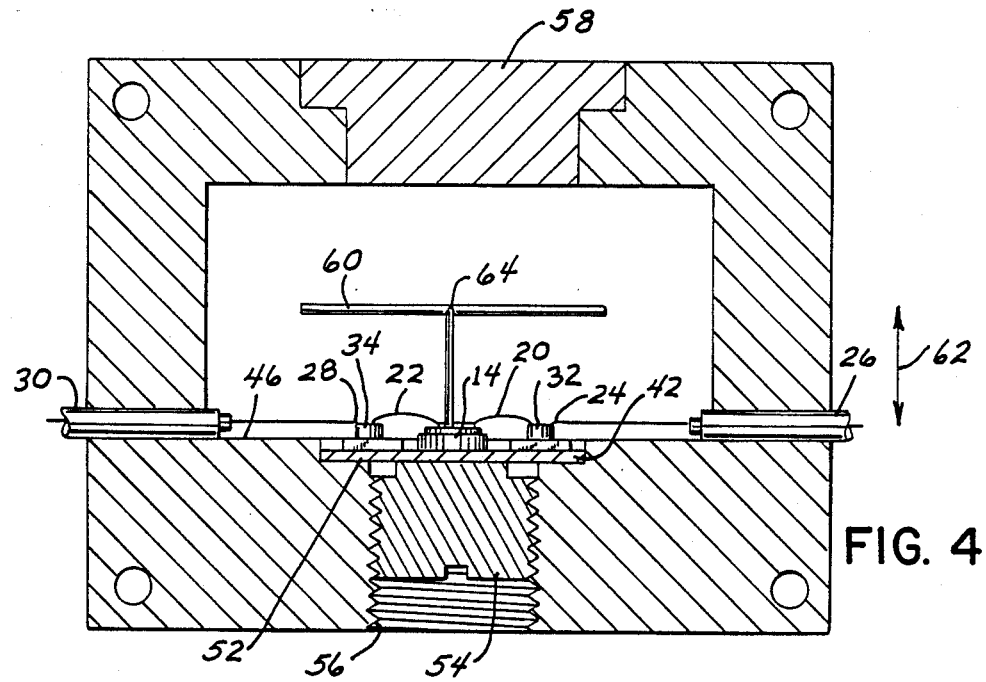
FIG. 4 is a sectional view taken along line 4—4 of FIG. 3.

As noted above, short monopole type antenna 18 transforms the impedance level of the lumped element VCO circuit, about 50 ohms, to the higher impedance level of the transmission media such as the waveguide or free space (i.e. greater than or equal to about 377 ohms). The lumped element circuit differs from previous approaches in which the impedance transformation was accomplished with a short length of probe coupled coaxial line that functioned as a coaxial to waveguide transformer. Monopole antenna 18 in combination simplifies the output coupling and results in the smallest oscillator size. As noted above, the VCO circuit was assembled on the 0.115 inch diameter flange of a standard packaged Gunn diode, which compares in size to the head of a match, for example as shown in FIG. 4 of the above noted Cohen article "Active Phase Shifters For The Millimeter And Microwave Bands". Iris output port 60 in front wall 48 is designed to be parallel resonant at the fundamental desired output frequency. At the second harmonic frequency, the iris appears as a low shunt impedance. Thus, the iris functions to transmit energy generated by the Gunn diode at the fundamental frequency and to suppress the transmission of energy generated at the second harmonic.

As noted above, the length of antenna 18 is nominally a quarter wavelength. If a quarter wave infinitely thin monopole is placed in a waveguide, its terminal impedance to the bottom wall of the waveguide would approach 36 ohms. By shaping the monopole and changing its length, various combinations of resistance and reactance, capacitive or inductive can be obtained. The impedance level at the base of the antenna is calculated from the experimental design curves presented by Jasik, above noted. These curves relate antenna resistance and reactance to frequency with the ratio of antenna length to diameter as a parameter. The impedance at the base of the antenna (antenna impedance) depends not only on the length and diameter of the antenna but also on the base condition, i.e. ground plane size and geometry. Thus, the value of antenna resistance and reactance obtained from the design curves (infinite ground plane) is an approximation and requires empirical refinement. Values of antenna resistance obtained from the design curves for VCO band edge frequencies of 36 and 38.6 GHz are given in Table 1

TABLE 1

| FREQ. (GHz) | ANTENNA LENGTH TO DIAMETER RATIO | ANTENNA LENGTH | RESISTANCE (OHMS) | REACTANCE (OHMS) |
|---|---|---|---|---|
| 36 | 20 | /4@37.3 GHz | 40 | 20 Inductive |
| 38.6 | 20 | /4@37.3 GHz | 50 | 40 Inductive |
| 36 | 20 | /5.3@37.3 GHz | 10 | 50 Capacitive |
| 38.6 | 20 | /5.3@37.3 GHz | 15 | 30 Capacitive |
| 36 | 15 | /5.3@37.3 GHz | 10 | 40 Capacitive |
| 38.6 | 15 | /5.3@37.3 GHz | 15 | 25 Capacitive |

Figure 5:
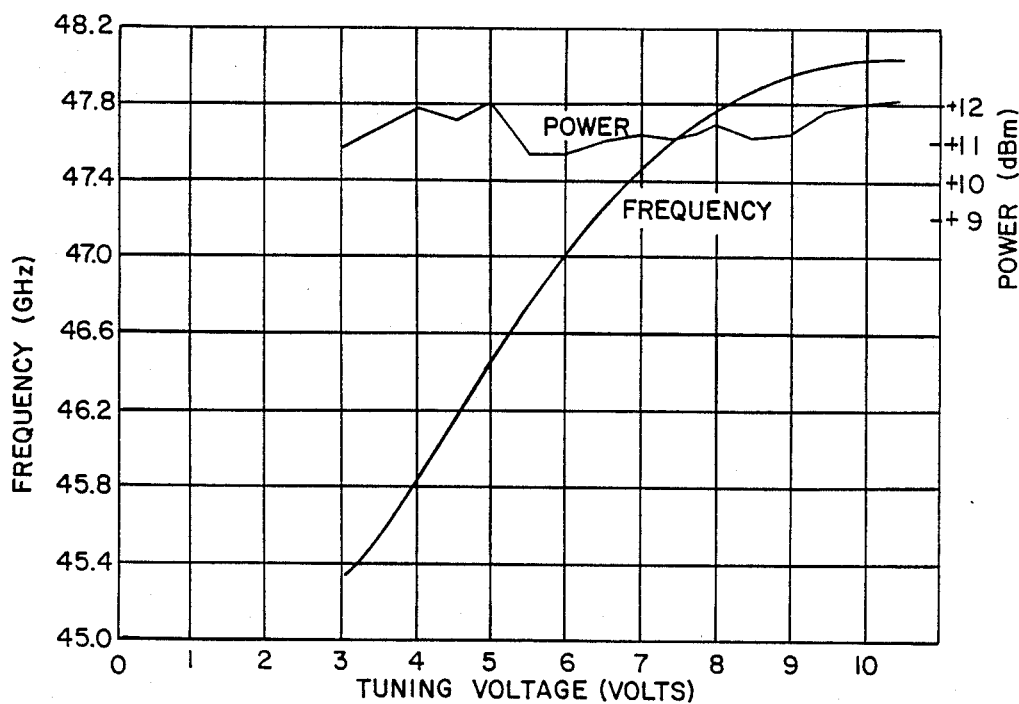
FIG. 5 is a graph showing tuning voltage versus frequency and versus output power for the circuitry of FIGS. 1-4.

These values indicate that the monopole configuration exhibits adequate bandwidth and that a suitable level of resistance can be presented to the Gunn diode. The measured tuning and output power characteristics are shown in FIG. 5. The VCO tuned from 45.3 to 48 GHz, a tuning range of 2.7 GHz. The corresponding tuning voltage range was −3 to −10.5 volts. Maximum and minimum output power over the band was +12.1 dBm and +10.7 dBm, respectively. The VCO used a hyperabrupt junction varactor with a junction capacitance of 0.135 pF and a gallium arsenide Gunn diode rated at 37 GHz.

It is recognized that various equivalents, alternatives and modifications are possible within the scope of the appended claims.

I claim:

1. An oscillator operational in the millimeter wave range including frequencies greater than 30 GHz, comprising:
    a lumped element active circuit including an active element with a negative resistance;
    a lumped element resonator circuit in parallel with said first mentioned circuit and providing resonant circuitry in combination therewith;
    an antenna extending directly from said oscillator without an intermediate impedance matching section therebetween and without an isolation element therebetween, said antenna having a length of nominally an odd quarter wavelength and having zero connection length from said oscillator.

2. The invention according to claim 1 comprising a housing mounting said oscillator and coupling said antenna to transmission redia providing a load, and wherein said antenna serves a dual function of radiating the energy generated by said oscillator and also transforming the output impedance of said oscillator to the impedance of said transmission media.

3. The invention according to claim 2 wherein said transmission media is free space.

4. The invention according to claim 2 wherein said transmission media is a waveguide.

5. An oscillator operational in the millimeter wave range including frequencies greater than 30 GHz, comprising:
   a lumped element active circuit including an active element with a negative resistance;
   a lumped element resonator circuit in parallel with said first mentioned circuit and providing resonant circuitry in combination therewith;
   an antenna extending directly from said oscillator and having a length of nominally an odd quarter wavelength at the fundamental frequency of said oscillator and having zero connection length from said oscillator;
   an output port including a resonant iris transmitting energy radiated by said antenna at said fundamental frequency.

6. The invention according to claim 5 wherein said oscillator has a second harmonic frequency, and wherein said antenna is spaced from said resonant iris by a distance of nominally an odd quarter wavelength at said second harmonic frequency, and wherein said resonant iris suppresses energy radiated by said antenna at said second harmonic frequency.

7. The invention according to claim 6 comprising a short circuit spaced from said antenna by a distance of nominally an odd quarter wavelength at said fundamental frequency.

8. The invention according to claim 7 wherein said short circuit is on the opposite side of said antenna from said resonant iris.

9. An oscillator operational in the millimeter wave range including frequencies greater than 30 GHz comprising:
   a bias port;
   an output port;
   a quarter wave choke having first and second terminals, said first terminal coupled to said bias port;
   a first circuit comprising a lumped element active circuit including an active element with a negative resistance, said first circuit having first and second terminals, said first terminal of said first circuit being coupled to said second terminal of said choke;
   a second circuit comprising a lumped element resonator circuit in parallel with said first circuit and providing resonant circuitry in combination therewith, said second circuit having first and second terminals, said first terminal of said second circuit being coupled to said second terminal of said choke and said first terminal of said first circuit, said second terminal of said second circuit being coupled to said second terminal of said first circuit;
   an antenna connected with zero connection length to said second terminal of said choke and said first terminal of said first circuit and said first terminal of said second circuit and radiating energy generated by said oscillator to said output port.

10. The invention according to claim 9 wherein said second circuit comprises a series lumped inductor and capacitor.

11. The invention according to claim 10 wherein said capacitor of said second circuit comprises a varactor and comprising a second quarter wave choke having a first terminal connected to said inductor and having a second terminal providing a varactor bias terminal, and comprising a varactor bias port coupled to said second terminal of said second quarter wave choke.

12. The invention according to claim 11 comprising:
   a first filter capacitor connected between said first terminal of said first choke and said second terminal of said first circuit;
   a DC blocking capacitor;
   said inductor having first and second terminals, said first terminal of said inductor being coupled through said DC blocking capacitor to said second terminal of said first choke and said first terminal of said first circuit and said antenna;
   said varactor having first and second terminals, said first terminal of said varactor being coupled to said second terminal of said inductor, said second terminal of said varactor being coupled to said second terminal of said first circuit;
   said first terminal of said second choke being coupled to said DC blocking capacitor;
   a second filter capacitor connected between said second terminal of said second choke and said second terminal of said varactor.

13. An oscillator operational in the millimeter wave range including frequencies greater than 30 GHz, comprising:
   a housing having a bottom wall, and front, back and side walls extending upwardly therefrom;
   a lumped element active circuit in said housing on said bottom wall including an active element with a negative resistance;
   a lumped element resonator circuit in said housing on said bottom wall in parallel with said first mentioned circuit and providing resonant circuitry in combination therewith;
   an antenna directly connected to and extending upwardly from said resonant circuitry, said antenna extending upwardly within said housing and being spaced between said front and back walls.

14. The invention according to claim 13 wherein said antenna radiates energy generated by said oscillator, and comprising an output port in one of said front and back walls of said housing transmitting the energy radiated by said antenna.

15. The invention according to claim 14 wherein said output port comprises a resonant iris in said front wall of said housing at a given height above said bottom wall.

16. The invention according to claim 15 wherein said antenna extends upwardly to a top end at about the height of said resonant iris.

17. The invention according to claim 16 wherein said resonant iris comprises an elongated slot-like aperture through said front wall and extending parallel to said bottom wall, and wherein said antenna extends generally upwardly and perpendicular to said elongated aperture.

18. The invention according to claim 17 wherein said antenna has a length of nominally an odd quarter wavelength, and wherein said elongated aperture through said front wall is centered therein.

19. The invention according to claim 15 wherein said oscillator has a fundamental frequency and a second harmonic frequency, and wherein said antenna is spaced forwardly of said back wall by a distance of nominally an odd quarter wavelength at said fundamental frequency, and wherein said antenna is spaced rearwardly of said front wall by a distance of nominally an odd quarter wavelength at said second harmonic frequency.

20. The invention according to claim 19 wherein said back wall provides a short circuit for energy radiated rearwardly from said antenna.

* * * * *